United States Patent [19]

Roppelt et al.

[11] Patent Number: 4,795,972

[45] Date of Patent: Jan. 3, 1989

[54] DIGITAL MEASURING METHOD AND APPARATUS FOR A QUASI-ANALOG MEASURED VALUE DISPLAY

[75] Inventors: Günter Roppelt, Nürnberg; Herbert Schick, Fürth, both of Fed. Rep. of Germany

[73] Assignee: Brown, Boveri & Cie A.G., Mannheim, Fed. Rep. of Germany

[21] Appl. No.: 34,851

[22] Filed: Apr. 3, 1987

[30] Foreign Application Priority Data

Apr. 8, 1986 [DE] Fed. Rep. of Germany ....... 3611681

[51] Int. Cl.⁴ ...................... G01R 15/08; G01R 17/06
[52] U.S. Cl. ................. 324/115; 324/99 D; 324/114; 364/483
[58] Field of Search ............ 324/115, 99 D, 114, 324/111, 142, 120; 364/483, 571; 340/753, 754

[56] References Cited

U.S. PATENT DOCUMENTS

| Re. 29,992 | 5/1979 | Wold | 324/99 D |
|---|---|---|---|
| 3,939,413 | 2/1976 | Milkovic | 324/142 |
| 4,247,855 | 1/1981 | Uede et al. | 340/753 |

FOREIGN PATENT DOCUMENTS

| 0015788 | 9/1980 | European Pat. Off. |
| 3238487 | 6/1983 | Fed. Rep. of Germany . |
| 3151627 | 7/1983 | Fed. Rep. of Germany . |
| 3305554 | 8/1984 | Fed. Rep. of Germany . |
| P327 | 1/1985 | Japan . |

*Primary Examiner*—Ernest F. Karlsen
*Attorney, Agent, or Firm*—Herbert L. Lerner; Laurence A. Greenberg

[57] ABSTRACT

A digital measuring method an apparatus for displaying quasi-analog measured values performs the steps of displaying a measurement scale and interconnected triggerable indicator segments on a display having a given indicator center distance, representing a measured value to be indicated by the position of the indicator segments, controlling the resolution of the quasi-analog measured value display in dependence of the number of indicator segments triggerable within a measurement period to be represented, setting the resolution substantially lower than a resolution with which an A/D converter connected to the display operates, and subjecting a control command for triggering an actual indicator segment to a hysteresis, which assures that a switchover from a previous indicator segment to an actual indicator segmet does not take place until the actual measured value has increased or decreased by substantially more than one-half the given indicator center distance.

6 Claims, 4 Drawing Sheets

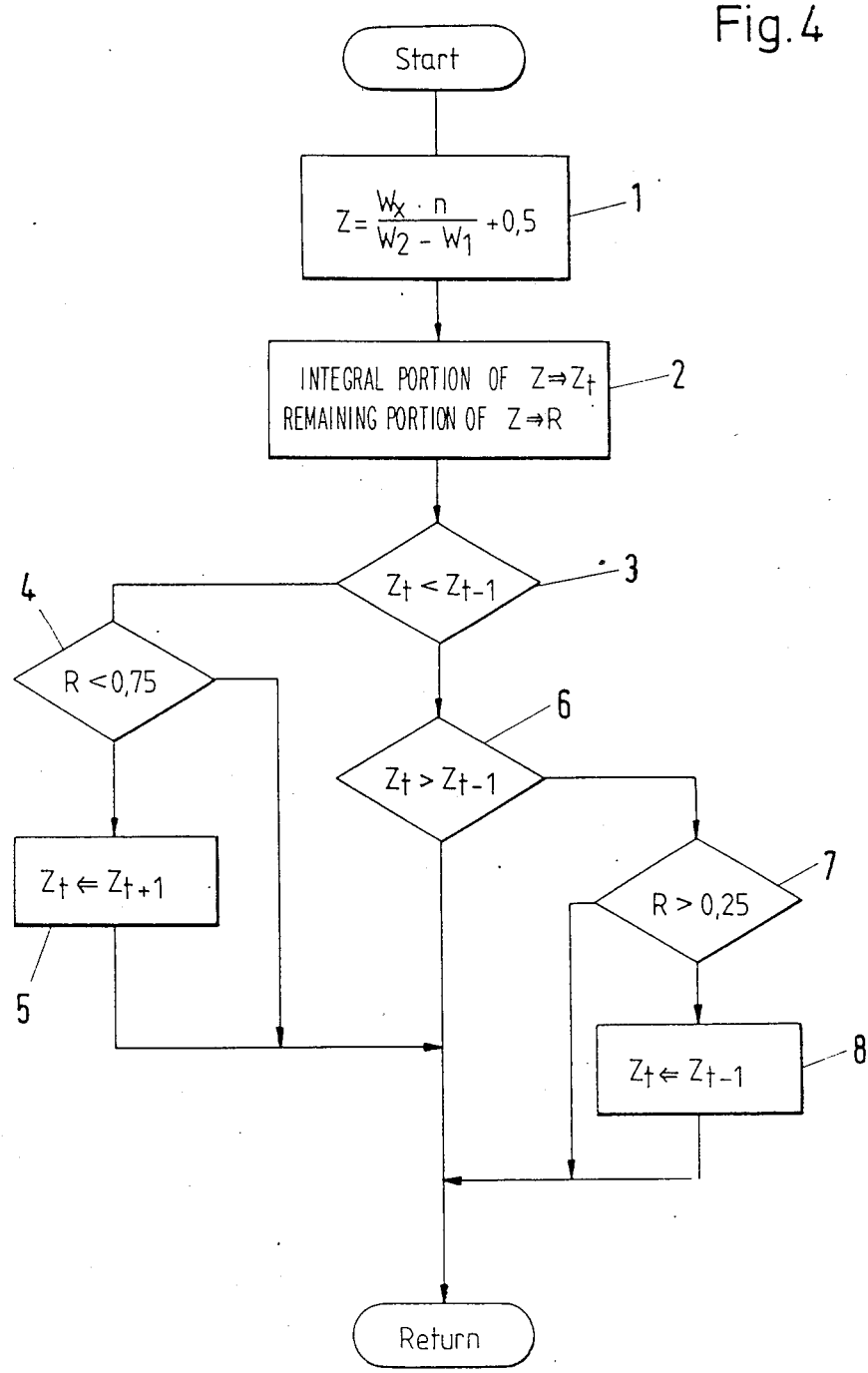

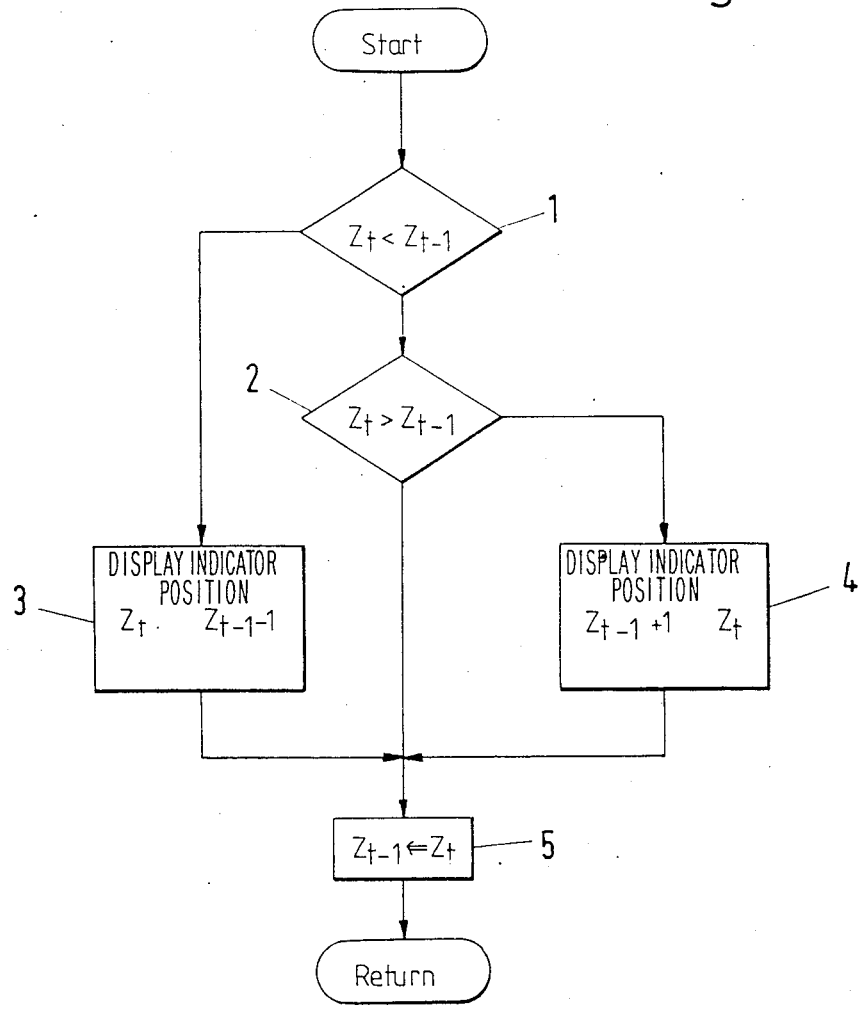
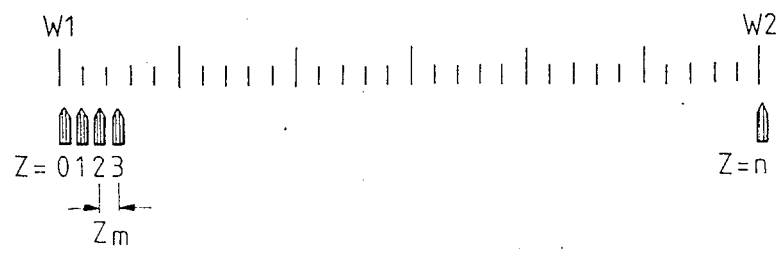

DIGITAL MEASURING METHOD AND APPARATUS FOR A QUASI-ANALOG MEASURED VALUE DISPLAY

The invention relates to a digital measuring method and apparatus for displaying quasi-analog measured values, including a display on which a measurement scale and interconnected triggerable indicator segments are disposed, in order to represent the measured value to be indicated by the position thereof, the resolution of the quasi-analog measured value display depending on the number of indicator segments triggerable within a measurement period to be represented, the resolution being substantially less than the resolution with which an A/D converter operates.

Numerical measured value displays as well as quasi-analog measured value displays can be provided with digital measuring methods. The combination of the two kinds of displays provides a very accurate and easy reading of the numerically displayed measured values, and the analog display provides a rough estimation of the absolute value and the trend the change is pursuing.

A display for showing quasi-analog measuring processes is formed of a plurality of interconnected or concatenated light emitting diodes or liquid crystal segments, which are triggerable individually through an electronic circuit, as described, for example, in German Patent No. DE-PS 21 41 361. Liquid crystals are preferred, not only because they require little power, but also because the shape of the individually triggerable panel segments are adaptable virtually arbitrarily to a given application.

In order to simulate a predetermined indicator position, the panel segment of a liquid crystal display closest to the indicator position to be simulated, is triggered. If not only this one panel segment but all of the panel segments located before it are triggered, then the display is said to be a bar or strip display, which makes the measured value perceptible from an even greater distance.

German Published, Non-Prosecuted Application No. DE-OS 34 08 026 discloses a digital measuring instrument in which a numerical display is combined with a quasi-analog display. The measured value scale reproduces a variable and suitably spread measuring range excerpt of a predetermined total measuring range. In this case it cannot be overlooked that the quasi-analog measured value display is based on a digital measuring method. Thus there is not a continuous change in position of the measured value indicator; instead, the indicator can only change its position in increments, in accordance with the location of the predetermined indicator segments. The number of the possible increments of the number of triggerable indicator segments determines the resolution of the quasi-analog display. The resolution is generally substantially less than the resolution of the digital numerical display.

For example, a numerical display having a resolution of ±30,000 digits may be associated with the following indicator resolutions:

| spread factor | x1 | x2 | x5 | x10 |
| --- | --- | --- | --- | --- |
| digit/indicator | 500 | 250 | 100 | 50 |

It is apparent that with a spread factor of 10, 50 digits are allocated to one indicator. If the spread factor is 1, that is if no spreading occurs, then as many as 500 digits are allocated to one indicator.

A direct conversion of the digital display into indicator positions means that one digit already brings about the switchover at the switchover point between two indicators. However, it is irritating if fluctuations of one digit are capable of causing a switchover of the indicator position, because after taking the indicator resolution into account this leaves the impression that the existing change in the measured value is substantially greater, in an extreme case by a factor of 500. A switchover of the indicator position that is this sensitive becomes particularly objectionable because of the fact that the A/D conversion can already entail a one-digit uncertainty. Uncertainties of one or more digits also are already brought about by the fact that the numerical display of the digital display is an average of at least eight individual measured values, and thus even with an absolutely stable numerical display, the quasi-analog display could jump back and forth by one indicator.

It is accordingly an object of the invention to provide a digital measuring method and apparatus for a quasi-analog measured value display, which overcomes the hereinafore-mentioned disadvantages of the heretofore-known methods and devices of this general type and with which a switchover of the indicator position in a quasi-analog measured value display takes place with an adaptation to its resolution. Disrupting or even misleading effects such as those described above should be avoided.

With the foregoing and other objects in view there is provided, in accordance with the invention, a digital measuring method for displaying quasi-analog measured values, which comprises displaying a measurement scale and interconnected or concatenated triggerable indicator segments on a display having a given indicator center distance, representing a measured value to be indicated by the position of the indicator segments, controlling the resolution of the quasi-analog measured value display in dependence on the number of indicator segments triggerable within a measurement period to be represented, setting the resolution substantially or essentially lower than a resolution with which an A/D converter connected to the display operates, and subjecting a control command for triggering an actual indicator segment to a hysteresis, which assures that a switchover from a previous indicator segment to an actual indicator segment does not take place until the actual measured value has increased or decreased by substantially more than one-half the given indicator center distance.

The center distance of the indicator is the distance between two adjacent indicator segments, measured from their center. If it is presumed that the individual indicator segments are located so closely together that the distance between their outer edges is negligible, then the indicator center distance corresponds to the indicator width. In the normal case, the indicator segment would be switched over as soon as the measured value exceeds the range symbolized by the indicator width, either upward or downward. The display range covered by an indicator segment thus corresponds to, ±½ of the indicator center distance. According to the invention, however, a further fraction of an indicator center distance is also added to half the indicator center distance for hysteresis, before the control command for triggering another indicator segment is issued. Thus a switchover between two indicators cannot occur until the measured value has increased or decreased by notably more than one-half an indicator center distance.

In accordance with another mode of the invention, there is provided a method which comprises fixing the hysteresis in each case to 0.25 of the given indicator center distance for both an increasing and a decreasing measured value, so that the control command for switchover of an indicator segment is issued as soon as the measured value varies by +0.75 of the given indicator center distance.

In accordance with a further mode of the invention, there is provided a method which comprises making the indicator hysteresis dependent on the condition that the change in the measured value is less than a given indicator center distance and is dispensed with when measured value changes are greater. In this way, if the measured value changes are greater, no hysteresis takes place.

With greater measured value changes, which elapse correspondingly slowly, the quasi-analog measured value display behaves similar to an analog measuring system. Due to the switchover of the indicator position, the indicator appears to follow the measured value continuously. However, if there is a rapid change in the measured value because of the relatively slow rate of change of approximately 20 per second (corresponding to approximately 50 ms), the number of measured value points emitted by the A/D converter may be less than the number of indicator positions located between the old and new measured values. The result, especially for sudden changes in measured value, is a highly discontinuous incrementing of the indicator marker, which is irritating in an analog display.

In accordance with an added mode of the invention, there is provided a method which comprises triggering at least one of the indicator segments located between an old and a new indicator segment to be triggered during the period of time of one measuring cycle, whenever no intermediate values are detected because of a low conversion rate, upon a rapid change in the measured value in which the new indicator segment is farther from the old indicator segment than one given indicator center distance. This avoids the discontinuities that arise. The result, which is similar to an analog measuring system, is a dynamic sweeper effect of the indicator marker, which makes it possible to follow even rapidly changing measured values.

In accordance with an a concomitant mode of the invention, there is provided a method which comprises triggering only the indicator segment representing the measured value in the last cycle before a measured value change, triggering the indicator segment representing the new measured value and all the indicator segments indicated between the old and the new indicator segment in the cycle during the measured value change, and triggering only the new indicator segment in the following cycle.

In order to carry out the method, there is also provided a digital measuring apparatus for displaying quasi-analog measured values, comprising a measurement value input for adapting a measured value, having an input for receiving the measured value and an output for delivering a signal, a microcomputer, a display with panel segments, a display driver connected between the microcomputer and the display, an operating unit connected to the microcomputer, means for delivering the signal from the output of the measurement value input directly to the microcomputer for detecting range parameters, an adaptation circuit and an A/D converter, means for delivering the signal from the measurement value input through the adaptation circuit and the A/D converter to the microcomputer, the microcomputer including means for converting the measured value into individual control signals required for activating the panel segments of the display and means for delivering the individual control signals through the display driver to the display, the operating unit including means for predetermining various parameters determining the measuring range, the spread of measuring range excerpts and other parameters defining the triggering of the panel segments for the microcomputer, and the microcomputer including means for checking if the prerequisites for switchover from one indicator segment to the next exist and if a plurality of indicator segments are to be triggered simultaneously during one measuring cycle.

Other features which are considered as characteristic for the invention are set forth in the appended claims.

Although the invention is illustrated and described herein as embodied in a digital measuring method and apparatus for a quasi-analog measured value display, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 4 is a flow chart for the indicator hysteresis;

FIG. 5 is a flow chart for the indicator sweeping action; and

FIG. 6 is an illustration explaining the symbols used.

Figure 1:
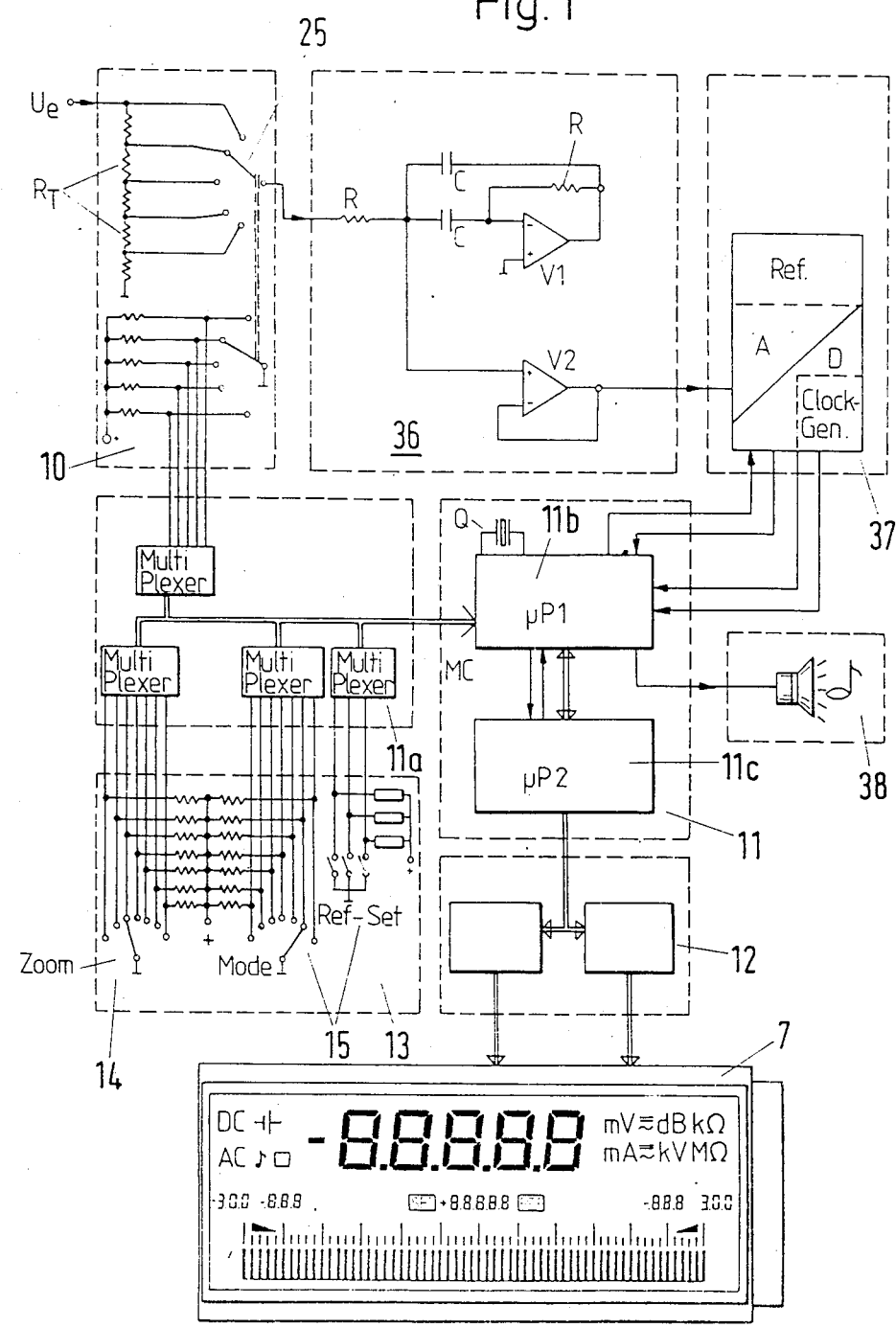
FIG. 1 is a schematic and block circuit diagram of a measuring instrument in which the method according to the invention is used.

Referring now to the figures of the drawings in detail and first, particularly, to FIG. 1 thereof, there is seen a measurement input unit 10 including a measuring range switch 25, which adapts an input signal $U_e$ and supplies it to an active filter 36, with the aid of voltage dividers $R_T$. The filter 36 is a second order low-pass filter and its task is to simulate the dynamic behavior of a rotating coil measuring system. A first operational amplifier V1 belonging to the low-pass filter has a good dynamic behavior and assures a low loading of the voltage divider $R_T$. A second operational amplifier V2 which is connected as a buffer, need not meet stringent dynamic demands, but it does assure low biasing and offset errors. The first operational amplifier is equipped with RC elements which permits a suppression of the alternating voltage signals, so that only a direct voltage signal is present at the output of the active filter. If an alternating voltage signal is to be measured, then a switchover must be performed before the active filter, such that the input signal $U_e$ is delivered to an effective value converter, which delivers a direct voltage to the filter 36 that is proportional to the effective value of the alternating voltage signal.

Downstream of the filter 36, the measured signal is converted in a 16-bit A/D converter 37, which is capable of converting at least 20 measurements per second. A reference voltage source is already integrated in the A/D converter, as is a clock generator, which sends a clock and status signal in accordance with the conversion rates to a microcomputer 11 downstream of the A/D converter.

In the illustrated embodiment, the microcomputer 11 includes a port expansion or extension 11a, a first microprocessor 11b and a second microprocessor 11c. The microcomputer 11 controls the entire course of measurement of the digital measuring instrument through a suitable program. On one hand, the first microprocessor 11b corresponds with the A/D converter 37 and on the other hand, it corresponds through the port expansion 11a with the measurement input unit 10 and a keyboard or operating unit 13. If valid measured values are present at the A/D converter, then the first microprocessor 11b, which is clock-stabilized by a quartz crystal Q, issues a command to serially read-in the data of the measured value over a start-convert line. The switch word is also taken over into the first microprocessor through the port expansion 11a. The prepared switch word includes 6 bytes and detects the positions of the measuring range switch 25 of the measurement input unit 10, of a zoom switch 14 and of a mode switch and reference set or ref-set switch 15. The switch word, a two-byte measurement word and two-byte control data are transferred to the second microprocessor 11c as soon as the second microprocessor is ready to receive data.

With the aid of multiplexers, the port expansion 11a makes it possible to reduce the numerous switch positions that are to be taken into account in the switch word to a few inputs of the first microprocessor 11b. The mode of operation of the switch provided on the keyboard 13 has already been described above. Therefore, the zoom switch determines the scale extension; the mode switch makes it possible to switch on the automatic scale selection, with a scale switchover taking place after delay periods of 1, 2 or 5 seconds, and the reference set switch permits the setting of a reference value with the aid of a reference value input key button ref-set indicated in FIG. 1.

A beeper 38 which is also connected to the first microprocessor 11b, enables an acoustical signal to be emitted, for such as when a reference value is attained or exceeded, or fails to be attained. By varying the signal frequency, it is also possible to signal when approaching or moving away from the reference value.

The essential work to be performed in displaying the measured value on a display 7, is performed by the second microprocessor 11c. On one hand, the second microprocessor 11c is connected to the first microprocessor 11b through a data bus and control lines, and in accordance with the program predetermined for it, it passes its instructions to LCD drivers, which in turn act directly on the panel segments of the LCD. A display driver 12 is connected between the microcomputer 11 and the display 7.

Figure 2:
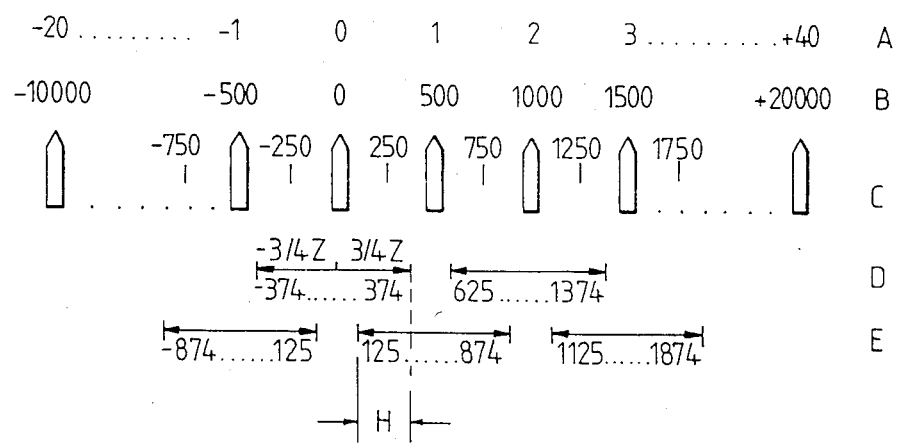
FIG. 2 is an illustration of the hysteresis occurring upon switchover between two adjacent indicator segments.

The display 7 corresponding to a quasi-analog measured value display shown in FIG. 1, is shown on a larger scale in FIG. 2. The example is based on a total of 60 indicator segments, with which 30,000 digits are associated. A scale is shown that extends from 0 to +20,000 and from 0 to −10,000 digits. Thus one indicator center distance represents an allocation of 500 digits. Accordingly, one-half an indicator center distance amounts to 250 digits and one-fourth an indicator center distance amounts to 125 digits. The hysteresis is fixed to one-fourth of the indicator center distance both for a rising and a falling measured value. A control command for switchover from one indicator segment to the next is thus issued at ±0.75 of the indicator center distance corresponding to ±375 digits. Line A of FIG. 2 identifies the particular indicator segment, while line B shows the number of the associated digits, line C shows the individual indicator segments and their switchover points and digits as they would be produced without hysteresis, and lines D and E show the switchover points and digits with hysteresis, in which an overlapping of the particular switching points or in other words the hysteresis H simultaneously becomes visible.

FIG. 4 is a flow chart showing the calculations and decisions to be performed by the microcomputer 11. The symbols used will be defined with aid of FIG. 6.

Accordingly,

W1 is the initial value of the scale;
W2 is the final value of the scale;
Wx is the actual measured value;
Z is an indicator segment;
$Z_t$ is an actual indicator segment;
$Z_{t-1}$ is the previous indicator segment;
Zm is the indicator center distance;
R is a nonintegral remainder value; and
n is the number of indicator increments.

After the measured value has been adopted and a mean value formed, the microcomputer first provides for the digital display. In the context of the overall program, the subroutine or subprogram for generating hysteresis is then run. In block 1 of FIG. 4, the basic condition for triggering the indicator segment Z representing the actual measured value Wx is fixed. In block 2, the evaluation takes place in accordance with the particular measured value change, with the integral portion (calculated in indicator center distances) according to block 1 effecting a change of the indicator segment Z at the actual indicator segment $Z_t$. A remainder value R is formed from the nonintegral portion. In block 3, a check is made as to whether the actual indicator segment is less than the previous indicator segment. If so, then a decision is made in block 4 as to whether the remaining nonintegral remainder value R is less than 0.75 of the indicator center distance. If not, then the next higher indicator segment is triggered in block 5. If so, the most recent indicator segment is triggered without change. In blocks 6, 7 and 8 the same decisions are repeated with an increasing measured value change. Once the decision chart has been run through, the cycle begins again from the beginning.

Figure 3:
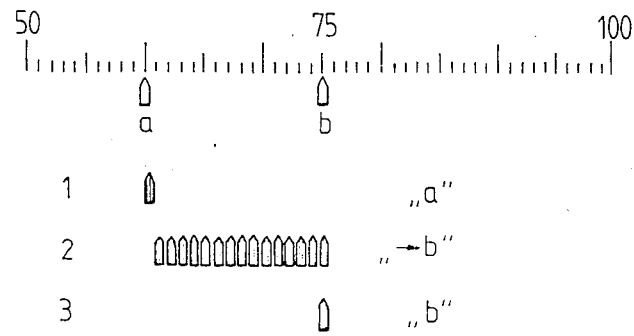
FIG. 3 is an illustration of the sweeper effect upon a rapid measured value change from a measured value a to a measured value b.

FIG. 3 illustrates the dynamic sweeping effect by means of which indicator jumping is to be avoided. A scale with two measuring indicators a and b for a measurement range of 50 to 100 is shown. The indicator position a represents the measured value that is ascertained in the first measurement cycle and the indicator position b represents the measured value which is produced after a rapid change in measured value. The rapid measured value change elapses in three measurement cycles. In the first measurement cycle only the indicator position a is shown and in the third measurement cycle only the indicator position b is shown. In the measurement cycle 2 therebetween, all of the indicator segments located between a and b and including the indicator segment b, are triggered. The result is a dynamic sweeping effect.

A flow chart for generating the sweeping effect is illustrated in FIG. 5. The blocks 1 and 2 decide whether the measured value corresponding to the actual indicator segment $Z_t$ is greater or less than the measured value corresponding to the previous indicator segment $Z_{t-1}$. If it is greater, then as shown in block 4, all of the indicator segments are triggered beginning at the indicator segment following the previous indicator segment and extending through the actual indicator segment. The same applies if the measured value corresponding to the actual indicator segment is less than the measured value corresponding to the previous indicator segment. Here again, all the indicator segments are displayed, from the previous one up to the actual indicator segment, except for the previous indicator segment itself. If neither the condition of block 1 nor the condition of block 2 is satisfied, then the most recent indicator segment remains triggered.

The foregoing is a description corresponding in substance to German Application No. P 36 11 681.5, dated Apr. 8, 1986, the International priority of which is being claimed for the instant application, and which is hereby made part of this application. Any material discrepancies between the foregoing specification and the aforementioned corresponding German application are to be resolved in favor of the latter.

We claim:

1. Digital measuring method for displaying quasi-analog measured values through a hysteresis function, which comprises displaying a measurement scale and a plurality of interconnected triggerable indicator segments disposed in a row on a display, the segments having a given indicator center distance, representing a measured value to be indicated by the position of the indicator segments, controlling the resolution of the quasi-analog measured value display in dependence on the number of the indicator segments within a measurement range to be represented, setting the resolution substantially lower than a resolution with which an A/D converter connected to the display operates, and activating a control command for triggering an actual indicator segment through said hysteresis function, which assures that a switchover from a previous indicator segment to a new indicator segment does not take place until the actual measured value has increased or decreased by substantially more than one-half the given indicator center distance.

2. Measuring method according to claim 1, which comprises fixing the degree of hysteresis in each case to 0.25 of the given indicator center distance for both an increasing and a decreasing measured value, so that the control command for switchover of an indicator segment is issued as soon as the measured value varies by ±0.75 of the given indicator center distance.

3. Measuring method according to claim 1, which comprises making the indicator hysteresis dependent on one of the conditions that the change in the measured value is less than a given indicator center distance and is cancelled when measured value changes are greater.

4. Measuring method according to claim 1, which comprises triggering at least one of the indicator segments located between an old and a new indicator segment to be triggered during the period of time of one measuring cycle, whenever no intermediate values are detected because of a low conversion rate, upon a rapid change in the measured value in which the new indicator segment is farther from the old indicator segment than one given indicator center distance.

5. Measuring method according to claim 4, which comprises triggering only the indicator segment representing the measured value in the last cycle before a measured value change, triggering the indicator segment representing the new measured value and all the indicator segments indicated between the old and the new indicator segment in the cycle during the measured value change, and triggering only the new indicator segment in the following cycle.

6. Digital measuring apparatus for displaying quasi-analog measured values, comprising a measurement value input for adapting a measured value, having an input for receiving the measured value and an output for delivering a signal, a microcomputer, a display with panel segments, a display driver connected between said microcomputer and said display, an operating unit connected to said microcomputer, means for delivering the signal from said output of said measurement value input directly to said microcomputer for detecting range parameters, an adaptation circuit and an A/D converter, means for delivering the signal from said measurement value input through said adaptation circuit and said A/D converter to said microcomputer, said microcomputer including means for converting the measured value into individual control signals required for activating said panel segments of said display and means for delivering the individual control signals through said display driver to said display, said operating unit including means for predetermining various parameters determining the measuring range, the spread of measuring range excerpts and other parameters defining the triggering of said panel segments for said microcomputer, and said microcomputer including means for checking if the prerequisites for switchover from one indicator segment to the next exist and if a plurality of indicator segments are to be triggered simultaneously during one measuring cycle.

* * * * *